(12) United States Patent
Kitamura et al.

(10) Patent No.: US 9,418,938 B2
(45) Date of Patent: Aug. 16, 2016

(54) SEMICONDUCTOR DEVICE HAVING A GRAPHENE INTERCONNECT

(71) Applicant: Kabushiki Kaisha Toshiba, Tokyo (JP)

(72) Inventors: Masayuki Kitamura, Yokkaichi (JP); Atsuko Sakata, Yokkaichi (JP); Hisao Miyazaki, Yokohama (JP); Akihiro Kajita, Yokkaichi (JP); Tadashi Sakai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 18 days.

(21) Appl. No.: 14/336,134

(22) Filed: Jul. 21, 2014

(65) Prior Publication Data

US 2015/0262940 A1    Sep. 17, 2015

(30) Foreign Application Priority Data

Mar. 14, 2014   (JP) ................................. 2014-051244

(51) Int. Cl.
| | |
|---|---|
| H01L 29/06 | (2006.01) |
| H01L 23/52 | (2006.01) |
| H01L 23/532 | (2006.01) |
| H01L 23/522 | (2006.01) |
| H01L 21/768 | (2006.01) |
| H01L 29/16 | (2006.01) |

(52) U.S. Cl.
CPC .... *H01L 23/53276* (2013.01); *H01L 21/76805* (2013.01); *H01L 21/76879* (2013.01); *H01L 21/76897* (2013.01); *H01L 23/5226* (2013.01); *H01L 23/53223* (2013.01); *H01L 23/53238* (2013.01); *H01L 23/53266* (2013.01); *H01L 29/1606* (2013.01); *H01L 2924/0002* (2013.01)

(58) Field of Classification Search
CPC .................................................... H01L 29/1606
See application file for complete search history.

(56) References Cited

U.S. PATENT DOCUMENTS

| | | | | |
|---|---|---|---|---|
| 7,732,859 B2* | 6/2010 | Anderson | ........... | H01L 29/1606 257/328 |
| 8,227,957 B2* | 7/2012 | Choi et al. | ..................... | 310/339 |
| 8,237,228 B2* | 8/2012 | Or-Bach | ............... | G03F 9/7076 257/369 |
| 8,395,191 B2* | 3/2013 | Or-Bach | ............... | G03F 9/7076 257/213 |
| 8,482,126 B2* | 7/2013 | Wada et al. | .................... | 257/750 |
| 8,710,672 B2* | 4/2014 | Katagiri et al. | ................ | 257/774 |
| 8,946,665 B2* | 2/2015 | Shim | .................. | H01L 29/7827 257/1 |
| 9,312,223 B2* | 4/2016 | Zhao | .................. | H01L 23/53276 |
| 2009/0283735 A1* | 11/2009 | Li et al. | .............. | 257/1 |
| 2011/0030772 A1* | 2/2011 | Veerasamy | .................... | 136/256 |
| 2011/0059599 A1* | 3/2011 | Ward | ..................... | B82Y 30/00 438/507 |
| 2012/0080662 A1 | 4/2012 | Saito et al. | | |
| 2012/0228614 A1* | 9/2012 | Kitamura | .......... | H01L 21/02491 257/52 |
| 2014/0061916 A1* | 3/2014 | Saito et al. | ..................... | 257/751 |
| 2014/0070425 A1* | 3/2014 | Wada et al. | ................... | 257/774 |

(Continued)

FOREIGN PATENT DOCUMENTS

| | | |
|---|---|---|
| JP | 2012-138451 | 7/2012 |
| JP | 2012-199305 | 10/2012 |

*Primary Examiner* — Ida M Soward
(74) *Attorney, Agent, or Firm* — Finnegan, Henderson, Farabow, Garrett & Dunner, LLP

(57) ABSTRACT

A semiconductor device includes a graphene interconnect, an insulation film formed on the graphene interconnect, and a via conducting portion formed in a via hole provided in the graphene interconnect and the insulation film. The graphene interconnect has a region containing an impurity at least around the via hole.

10 Claims, 6 Drawing Sheets

(56) References Cited

U.S. PATENT DOCUMENTS

2014/0284802 A1* 9/2014 Sakata .............. H01L 21/76805
    257/762

2015/0061131 A1* 3/2015 Saito .................... H01L 23/481
    257/741

* cited by examiner

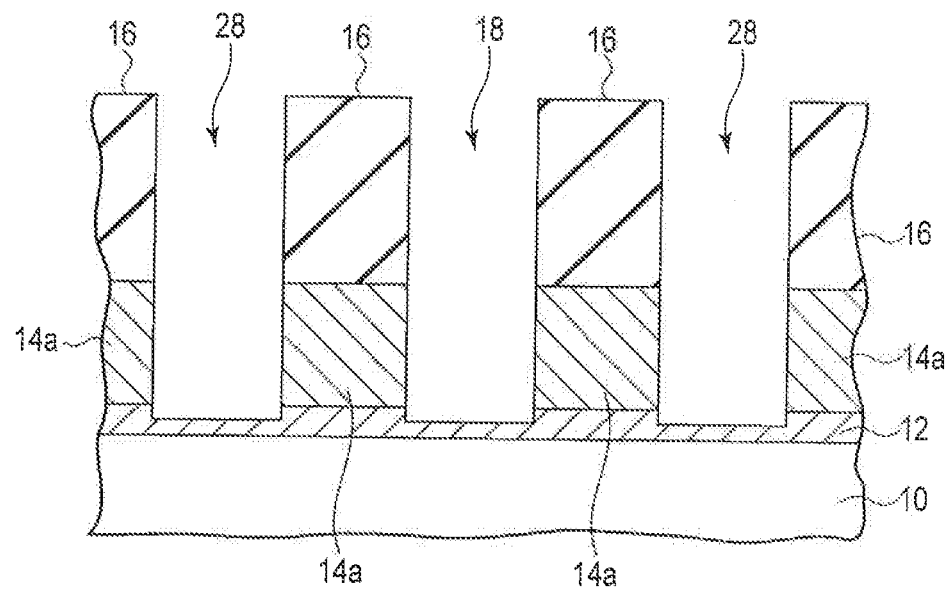
F I G. 9
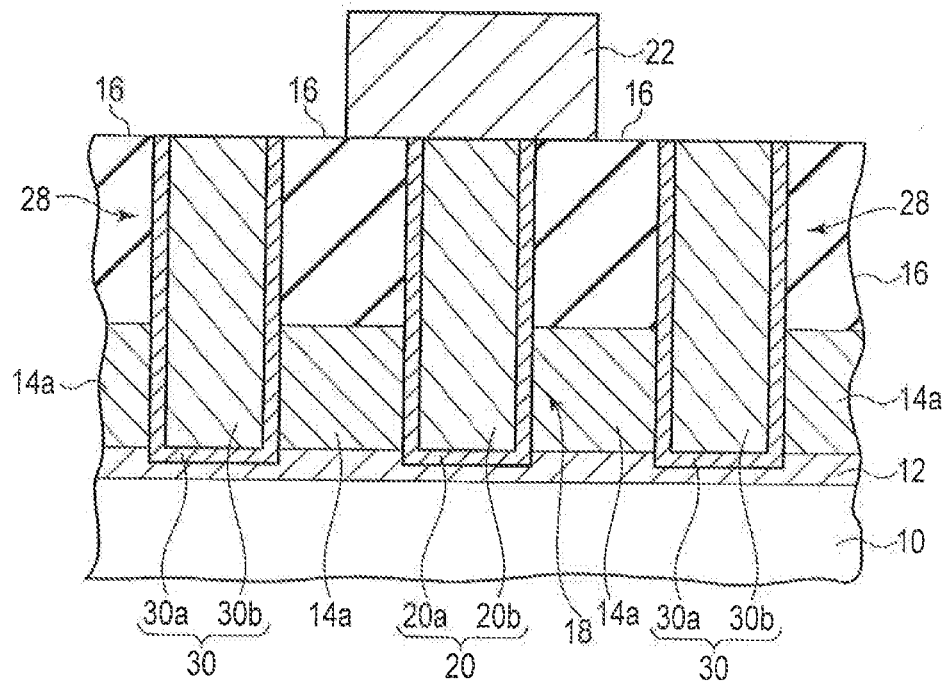
F I G. 10

US 9,418,938 B2

SEMICONDUCTOR DEVICE HAVING A GRAPHENE INTERCONNECT

CROSS-REFERENCE TO RELATED APPLICATIONS

This application is based upon and claims the benefit of priority from Japanese Patent Application No. 2014-051244, filed Mar. 14, 2014, the entire contents of which are incorporated herein by reference.

FIELD

Embodiments described herein relate generally to a semiconductor device and a method of manufacturing the same.

BACKGROUND

In accordance with development of microfabrication of semiconductor devices, increases in interconnect resistance due to interface inelastic scattering of electrons have become problematic. To overcome this problem, the use of a graphene interconnect has been proposed. Graphene exhibits ballistic conduction and little interface scattering of electrons. Accordingly, when the graphene interconnect is microfabricated, increases in resistance due to interface scattering will little occur.

However, in the graphene interconnect, six-membered rings formed of carbon atoms are continuously arranged along the surface of a substrate, which significantly strengthens the bonding of the carbon atoms. Accordingly, when a via conducting portion is provided on the graphene interconnect, the contact resistance therebetween will inevitably increase.

In view of the above, there is a demand for reducing the contact resistance between the graphene interconnect and the via conducting portion to realize a low-resistance interconnect structure.

BRIEF DESCRIPTION OF THE DRAWINGS

FIG. 9 is a schematic cross-sectional view for explaining part of a semiconductor device manufacturing method according to a third embodiment;

FIG. 10 is a schematic cross-sectional view for explaining part of the semiconductor device manufacturing method according to the third embodiment.

DETAILED DESCRIPTION

In general, according to one embodiment, a semiconductor device includes: a graphene interconnect; an insulation film formed on the graphene interconnect; and a via conducting portion formed in a via hole provided in the graphene interconnect and the insulation film.

Embodiments will be described with reference to the accompanying drawings.

(First Embodiment)

Figure 4:
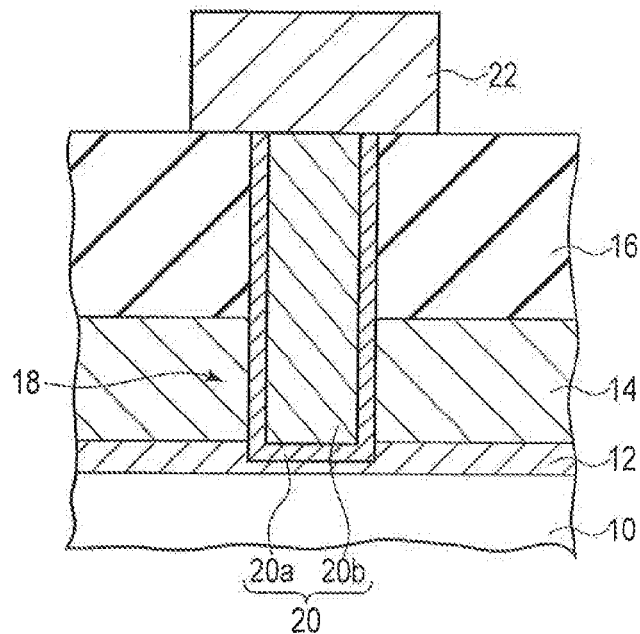
FIG. 4 is a schematic cross-sectional view for explaining part of the semiconductor device manufacturing method according to the first embodiment.

FIG. 4 is a schematic cross-sectional view showing the structure of a semiconductor device according to a first embodiment.

As shown, an underlying film 12 is formed on an underlying region 10 that includes a semiconductor substrate (not shown), a transistor (not shown), an underlying contact (not shown), etc. A graphene interconnect 14 is formed on the underling film 12. An insulation film (interlayer insulation film) 16 is formed on the graphene interconnect 14. A via hole 18 is formed in the graphene interconnect 14 and the interlayer insulation film 16, and a via conducting portion 20 is provided in the via hole 18. An upper-layer interconnect 22 is connected to the via conducting portion 20.

The underlying film 12 includes a barrier metal layer, and a catalytic layer formed on the barrier metal layer. The barrier metal layer is provided to cause the catalytic layer to have a hexagonal close-packed structure with an orientation of (002) or to have a face-centered cubic structure with an orientation of (111), and is a stacked film of Ti and TiN. The catalytic layer functions as a catalyst when graphene is grown, and is formed of Ni.

The graphene interconnect 14 is formed of multilayer graphene. The multilayer graphene is formed of a plurality of layers formed of C atoms. Each layer has a structure in which six-membered rings formed of carbon atoms are arranged along the surface of the substrate.

The interlayer insulation film 16 is provided to insulate the layer of the graphene interconnect 14 and the layer of the upper-layer interconnect 22, and is formed of, for example, SOG.

The via hole 18 is formed in the graphene interconnect 14 and the interlayer insulation film 16. In the first embodiment, the bottom of the via hole 18 is positioned deeper than the bottom of the graphene interconnect 14. Namely, the via hole 18 extends into the underlying film 12 formed beneath the graphene interconnect 14.

The via conducting portion 20 includes an outer conducting portion 20a formed of a barrier metal, and an inner conducting portion 20b formed inside the outer conducting portion 20a. The outer conducting portion 20a contains at least one of nickel (Ni), cobalt (Co), iron (Fe), palladium (Pd), platinum (Pt) and iridium (Ir). The inner conducting portion 20b is formed of a metal film or a carbon film. The metal film is formed of, for example, tungsten (W), copper (Cu) or aluminum (Al). The carbon film is formed of, for example, a carbon nanotube (CNT).

As described above, in the first embodiment, the via conducting portion 20 is provided in the via hole 18 formed in the underlying film 12, the graphene interconnect 14 and the interlayer insulation film 16. When the via hole 18 is formed, the bonding of carbon atoms forming the graphene interconnect 14 is cut, and the composition element(s) of the via conducting portion 20 is bonded to the cut portion of the carbon atoms. Consequently, in the first embodiment, the contact resistance between the graphene interconnect 14 and the via conducting portion 20 can be reduced.

Further, in the first embodiment, the bottom of the via hole 18 is positioned deeper than that of the graphene interconnect 14. Therefore, the contact area between the graphene interconnect 14 and the via conducting portion 20 can be increased to thereby reduce the contact resistance therebetween.

Figure 4A:
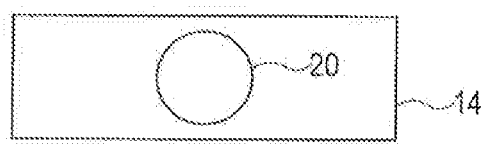
FIG. 4A shows the positional relationship between a via conducting portion and a graphene interconnect, according to the first embodiment.

Furthermore, in the first embodiment, as shown in FIG. 4A, the diameter of the via conducting portion 20 is smaller than the width of the graphene interconnect 14, and the via conducting portion 20 is formed to avoid the edges of the graphene interconnect 14. By virtue of this structure, ballistic conduction, which mainly occurs at the edges of an interconnect, can be reliably kept to thereby provide a low-resistance interconnect structure. If the above-mentioned positional relationship between the via conducting portion 20 and the graphene interconnect 14 is satisfied at least at the bottom of the via conducting portion 20, ballistic conduction can be maintained at least in the lower region of the graphene interconnect 14.

A method of manufacturing the semiconductor device of the first embodiment will now be described. FIGS. 1 to 4 are cross-sectional views schematically showing the method of the embodiment.

Figure 1:
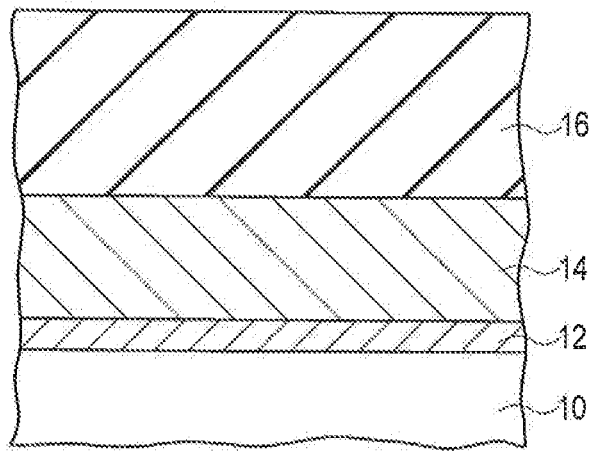
FIG. 1 is a schematic cross-sectional view for explaining part of a semiconductor device manufacturing method according to a first embodiment.

In the step of FIG. 1, firstly, the underlying film 12 is formed on the underlying region 10. Namely, a barrier metal layer is formed on the underlying region 10, and a catalytic layer is formed on the barrier metal layer. Subsequently, the graphene interconnect 14 is formed on the underlying film 12. More specifically, a graphene layer is formed by thermal CVD or plasma CVD, using a gas, such as $C_2H_6$, containing carbon (C). The graphene layer is processed by RIE to form the graphene interconnect 14. Subsequently, the insulation film (interlayer insulating film) 16 is formed on the graphene interconnect 14. More specifically, the interlayer insulation film 16, which covers the graphene interconnect 14, is formed by coating the entire surface with, for example, SOG.

Figure 2:
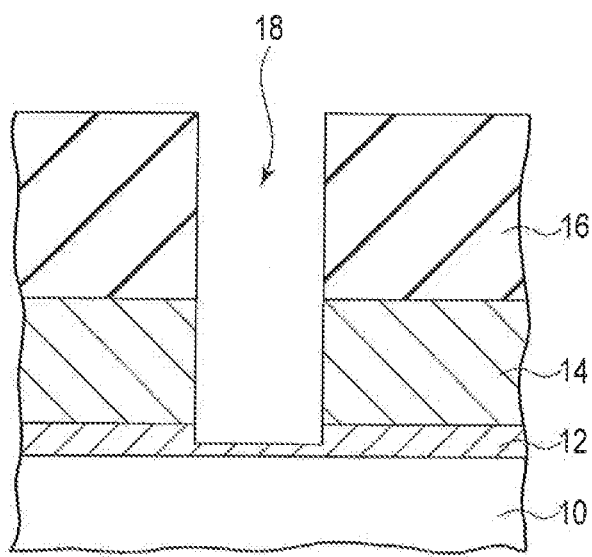
FIG. 2 is a schematic cross-sectional view for explaining part of the semiconductor device manufacturing method according to the first embodiment.

In the step of FIG. 2, the via hole 18 is formed in the interlayer insulation film 16, the graphene interconnect 14 and the underlying film 12. More specifically, the interlayer insulation film 16, the graphene interconnect 14 and the underlying film 12 are etched by RIE to form the via hole 18. In the first embodiment, the bottom of the via hole 18 is positioned deeper than that of the graphene interconnect 14. When the via hole 18 is formed, the bonding of carbon atoms forming the graphene interconnect 14 is cut. Accordingly, the carbon atoms whose bonding is cut are exposed at the surface defining the via hole 18.

Figure 3:
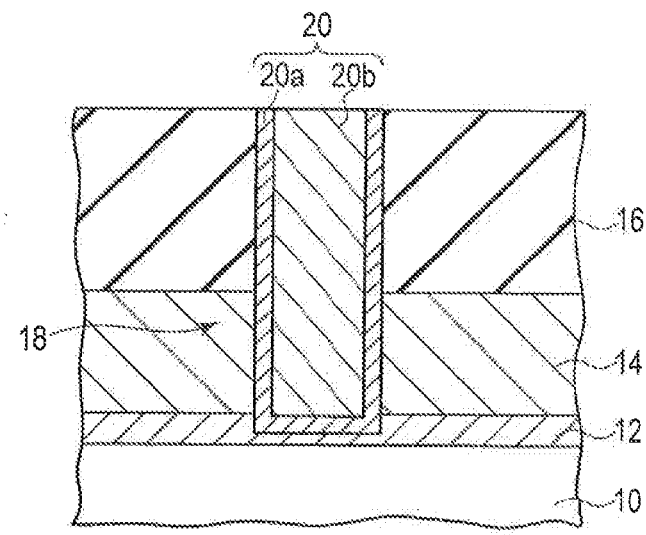
FIG. 3 is a schematic cross-sectional view for explaining part of the semiconductor device manufacturing method according to the first embodiment.

In the step of FIG. 3, the via conducting portion 20 is formed in the via hole 18. More specifically, a barrier metal film is formed on the entire surface by PVD or CVD, and a metal or carbon film is formed on the barrier metal film. Further, the via conducting portion 20 including the outer conducting portion 20a and the inner conducting portion 20b is formed in the via hole 18 by CMP. Since the carbon atoms whose bonding is cut are exposed at the inner surface of the via hole 18, the composition element(s) of the outer conducting portion 20a is bonded to the carbon-bonding-cut portion. As a result, the contact resistance between the graphene interconnect 14 and the via conducting portion 20 can be reduced.

In the step of FIG. 4, the upper-layer interconnect 22 is formed on the via conducting portion 20 and the interlayer insulation film 16. The upper-layer interconnect 22 is connected to the graphene interconnect 14 via the via conducting portion 20.

As described above, in the first embodiment, the bonding of carbon atoms forming the graphene interconnect 14 is cut when the via hole 18 is formed, and the composition element(s) of the via conducting portion 20 (i.e., the composition element(s) of the outer conducting portion 20a) is bonded to the cut portion of the carbon atoms. Consequently, in the first embodiment, the contact resistance between the graphene interconnect 14 and the via conducting portion 20 can be reduced.

Figure 5:
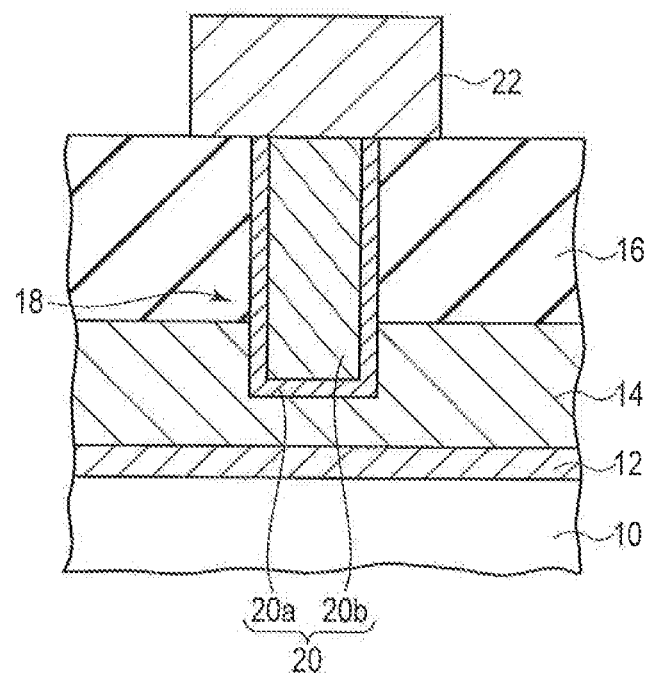
FIG. 5 is a schematic cross-sectional view showing the structure of a semiconductor device according to a first modification of the first embodiment.

FIG. 5 is a schematic cross-sectional view showing the structure of a semiconductor device according to a first modification of the first embodiment. In the first embodiment, the bottom of the via hole 18 is positioned deeper than that of the graphene interconnect 14. In contrast, in the first modification, the bottom of the via hole 18 is positioned shallower than that of the graphene interconnect 14.

Figure 6:
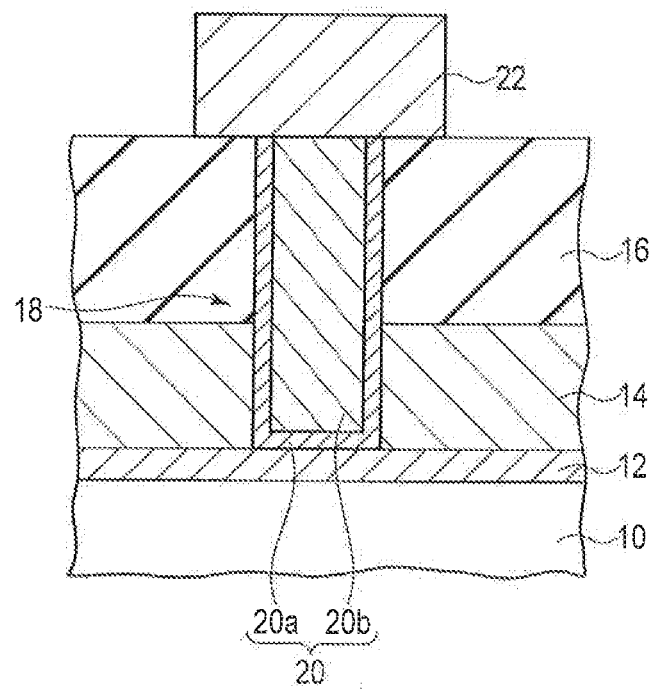
FIG. 6 is a schematic cross-sectional view showing the structure of a semiconductor device according to a second modification of the first embodiment.

FIG. 6 is a schematic cross-sectional view showing the structure of a semiconductor device according to a second modification of the first embodiment. In the second modification, the bottom of the via hole 18 is substantially level with that of the graphene interconnect 14. Namely, the bottom of the via conducting portion 20 is in contact with the upper surface of the underlying film 12.

In both the first and second modifications, the bonding of carbon atoms forming the graphene interconnect 14 is cut when the via hole 18 is formed, the composition element(s) of the via conducting portion 20 (i.e., the composition element(s) of the outer conducting portion 20a) is bonded to the cut portion of the carbon atoms. Consequently, the contact resistance between the graphene interconnect 14 and the via conducting portion 20 can be reduced, as in the above-described embodiment.

Also, in the first modification, the bottom of the via hole 18 is positioned shallower than that of the graphene interconnect 14, and hence at least in the lower region of the graphene interconnect 14, the via hole 18 does not cross any of the edges of the graphene interconnect 14. Accordingly, ballistic conduction can be reliably maintained at least in the lower region of the graphene interconnect 14.

(Second Embodiment)

A description will now be given of a second embodiment. Since the second embodiment is similar to the first embodiment in basic structure and manufacturing method, the matters described in the first embodiment will not be described again.

Figure 8:
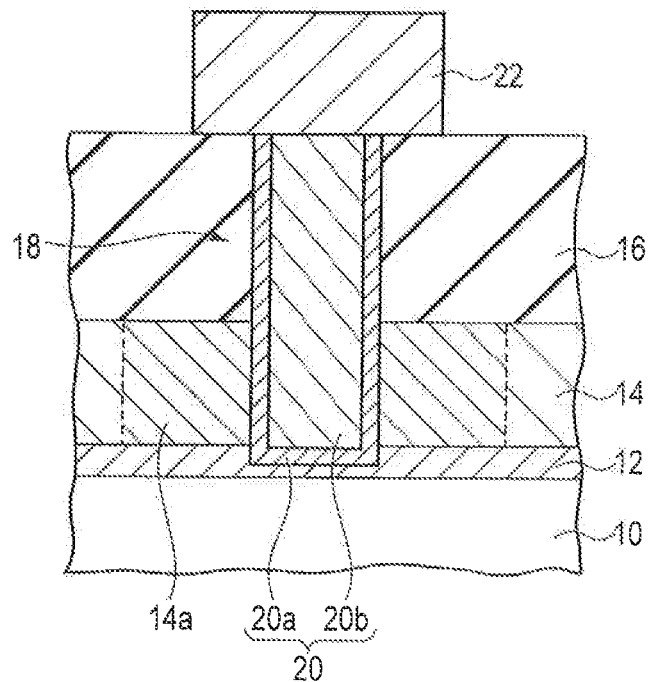
FIG. 8 is a schematic cross-sectional view for explaining part of the semiconductor device manufacturing method according to the second embodiment.

FIG. 8 is a schematic cross-sectional view showing a semiconductor device according to the second embodiment. In the second embodiment, the elements similar to those of the first embodiment are denoted by corresponding reference numbers, and no detailed description will be given thereof.

In the second embodiment, the graphene interconnect 14 has a region (impurity region) 14a containing an impurity. The impurity region 14a is formed around the via hole 18 and the concentration of the impurity decreases as the distance from the via hole 18 increases. In the second embodiment, phosphorus (P) is used as the impurity. The other basic structures are similar to those of the first embodiment.

The second embodiment can provide the same advantages as the first embodiment. In addition, in the second embodiment, the region (impurity region) 14a of the graphene interconnect 14, which contains an impurity, can reduce the resistance of the graphene interconnect 14.

Figure 7:
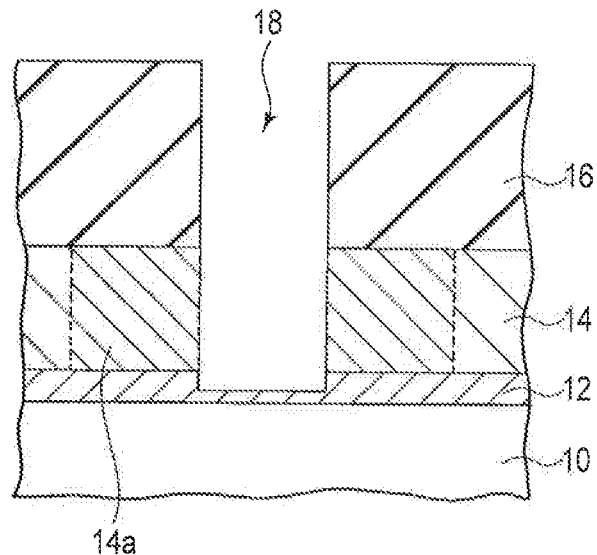
FIG. 7 is a schematic cross-sectional view for explaining part of a semiconductor device manufacturing method according to a second embodiment.

A method of manufacturing the semiconductor device of the second embodiment will be described. FIGS. 7 and 8 are cross-sectional views schematically showing the manufacturing method of the second embodiment.

Firstly, the same steps as the steps of the first embodiment shown in FIGS. 1 and 2 are executed, thereby forming the via hole 18.

Subsequently, the step of FIG. 7 is executed. In the step of FIG. 7, an impurity (phosphorus) is introduced into the graphene interconnect 14 from the lateral surface of the via hole 18. This process step is an intercalation step in which the impurity is introduced into the graphene structure. By this intercalation step, the impurity region 14a is formed in the graphene interconnect 14. More specifically, phosphorus is introduced into the graphene interconnect 14 by a heat treatment (approximation. 100 to 600° C.) in an atmosphere of $PH_3$ gas. Since thus, an impurity (phosphorus) is introduced into the graphene interconnect 14 from the lateral surface of the via hole 18, the impurity region 14a is formed around the via hole 18 so that the concentration of the impurity decreases as the distance from the via hole 18 increases.

After that, the step of FIG. 8 is executed. In the step of FIG. 8, a via conducting portion 20 is formed in the via hole 18 as in the first embodiment. Further, an upper-layer interconnect 22 is formed on the via conducting portion 20 and the interlayer insulation film 16 as in the first embodiment.

Thus, in the second embodiment, the impurity is introduced into the graphene interconnect 14 from the lateral surface of the via hole 18, and therefore can be easily introduced into the graphene interconnect 14. Namely, where the impurity is introduced into the graphene interconnect 14 from the upper surface of the graphene interconnect 14, the impurity is hard to vertically diffuse because the graphene has a layer structure, and hence cannot be introduced into the deep portion of the graphene interconnect 14. In contrast, in the embodiment, the impurity is introduced into the graphene interconnect 14 from the lateral surface of the via hole 18, and therefore can be easily diffused into a large region in the graphene interconnect 14.

In the above-described embodiment, the impurity region 14a may contain, in general, at least one of phosphorus (P), nitrogen (N), arsenic (As), antimony (Sb), bismuth (Bi), fluorine (F), chlorine (Cl), bromine (Br), iodine (I), astatine (At), hydrogen (H), boron (B), lithium (Li), sodium (Na), kalium (K), rubidium (Rb), cesium (Cs), beryllium (Be), magnesium (Mg), calcium (Ca), strontium (Sr), barium (Ba), samarium (Sm), Europium (Eu), ytterbium (Yb) and thulium (Tm).

(Third Embodiment)

A third embodiment will be described. Since the third embodiment is similar to the first and second embodiments in basic structure and manufacturing method, the matters already described in the first or second embodiment will not be described again.

Figure 11:
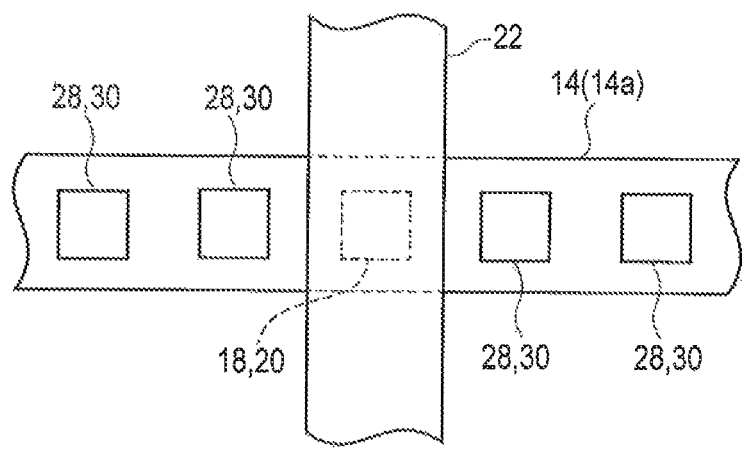
FIG. 11 is a schematic view showing the planar positional relationship between structural elements of a semiconductor device according to the third embodiment.

FIG. 10 is a schematic cross-sectional view showing the structure of the semiconductor device according to the third embodiment. FIG. 11 is a schematic view showing the planar positional relationship between structural elements of the semiconductor device according to the third embodiment. In these figures, elements similar to those of the first and second embodiments are denoted by corresponding reference numbers, and no detailed description will be given thereof.

In the third embodiment, the graphene interconnect 14 has a region (impurity region) 14a containing an impurity, as in the second embodiment. Further, in the third embodiment, dummy via holes 28 are formed, as well as the via hole 18, in the underlying film 12, the graphene interconnect 14 and the interlayer insulation film 16. The dummy via holes 28 are provided along the interconnect length direction of the graphene interconnect 14. The concentration of the impurity in the impurity region 14a decreases as the distance from each dummy via hole 28 increases. Further, in each dummy via hole 28, a dummy via conducting portion 30 is formed. The dummy via conducting portion 30 is similar to the via conducting portion 20 in structure, and includes an outer conducting portion 30a and an inner conducting portion 30b. The outer conducting portion 30a and the inner conducting portion 30b are formed in the same process steps as the outer conducting portion 20a and the inner conducting portion 20b, respectively. Accordingly, the outer and inner conducting portions 30a and 30b are formed of the same materials as the outer and inner conducting portions 20a and 20b, respectively.

In the third embodiment, an upper-layer interconnect 22 is connected to the via conducting portion 20 as in the first and second embodiments. However, the dummy via conducting portions 30 are not used for signal transmission. Namely, the dummy via conducting portions 30 are not used for connecting interconnect. Accordingly, no upper-layer interconnect is connected to the dummy via conducting portions 30. Further, as shown in FIG. 11, the diameter of each dummy via conducting portion 30 is formed smaller than the interconnect width of the graphene interconnect 14, and the dummy via holes 28 are formed in positions in which they do not cut the bonding of carbon atoms in each edge of the graphene interconnect 14.

The third embodiment can provide the same advantages as the first and second embodiments. In addition, in the third embodiment, the impurity regions 14a are formed around not only the via hole 18 but also the dummy via holes 28, which further reduces the resistance of the graphene interconnect 14 than in the second embodiment.

Moreover, in general, in the graphene interconnect 14, ballistic conduction is dominant at its edges, while normal conduction is dominant in the region between the edges. In general, the via hole 18 and the dummy holes 28 are formed in the width-directional central portion of the graphene interconnect 14 that avoid the edges. Since normal conduction is dominant in the central portion of the graphene interconnect 14, impurity regions 14a can be formed in large regions between the edges of the graphene interconnect 14, if they are formed around the via hole 18 and the dummy via holes 28. As a result, the conductance based on normal conduction can be increased with the ballistic conduction maintained at the edges of interconnect, whereby interconnect resistance can be effectively reduced.

In addition, if the sizes, intervals, etc., of the dummy via holes are appropriately set, the impurity regions 14a can be formed in substantially the entire region of the graphene interconnect 14. Each dummy via hole 28 may be formed to have a size identical to or different from that of the via hole 18. For instance, each dummy via hole 28 may be formed smaller than the via hole 18. In this case, the resistance of the graphene interconnect 14 can be further reduced.

A method of manufacturing the semiconductor device of the third embodiment will be described. FIGS. 9 and 10 are cross-sectional views schematically showing the semiconductor device manufacturing method of the third embodiment.

Firstly, the same process steps as those of FIGS. 1 and 2 associated with the first embodiment are executed. In the third embodiment, however, the dummy via holes 28 are formed in the underlying film 12, the graphene interconnect 14 and the interlayer insulation film 16, when the via hole 18 is formed in the underlying film 12, the graphene interconnect 14 and the interlayer insulation film 16.

Secondly, the step of FIG. 9 is executed. The step of FIG. 9 is similar to that of FIG. 7 associated with the second embodiment. In the third embodiment, however, when the impurity (phosphorus) is introduced into the graphene interconnect 14 from the lateral surface of the via hole 18, it is also introduced into the graphene interconnect 14 from the lateral surfaces of the dummy via holes 28. As a result, the impurity regions 14a are formed in large regions in the graphene interconnect 14. Since thus, the impurity (phosphorus) is introduced into the graphene interconnect 14 from the lateral surfaces of the via hole 18 and the dummy via holes 28, the impurity regions 14a are formed around the via hole 18 and the dummy via holes 28, so that the concentration of the impurity decreases as the distance from each of the via hole 18 and the dummy via holes 28 increases.

Thereafter, the step of FIG. 10 is executed. In the step of FIG. 10, the via conducting portion 20 is formed in the via hole 18 as in the first embodiment. In the third embodiment, however, when the via conducting portion 20 is formed in the via hole 18, the dummy via conducting portions 30 are formed in the dummy via holes 28. Further, as in the first embodiment, the upper-layer interconnect 22 is formed on the via conducting portion 20 and the interlayer insulation film 16.

As described above, in the third embodiment, since the impurity is introduced into the graphene interconnect 14 from the lateral surfaces of the via hole 18 and the dummy via holes 28, it can be easily introduced into large regions in the graphene interconnect 14.

Also in the third embodiment, the same impurity as that of the second embodiment can be contained in the impurity regions 14a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a graphene interconnect;
   an insulation film formed on the graphene interconnect; and
   a via conducting portion formed in a via hole provided in the graphene interconnect and the insulation film,
   wherein the graphene interconnect has a region containing an impurity at least around the via hole.

2. The semiconductor device of claim 1, wherein a bottom of the via hole is positioned deeper than a bottom of the graphene interconnect.

3. The semiconductor device of claim 1, wherein a bottom of the via hole is positioned shallower than a bottom of the graphene interconnect.

4. The semiconductor device of claim 1, wherein a bottom of the via hole is substantially level with a bottom of the graphene interconnect.

5. The semiconductor device of claim 1, further comprising an underlying film formed beneath the graphene interconnect, wherein the via hole is extended into the underlying film.

6. The semiconductor device of claim 1, wherein at least a bottom of the via conducting portion has a diameter smaller than a width of the graphene interconnect.

7. The semiconductor device of claim 1, wherein a concentration of the impurity decreases as a distance from the via hole increases.

8. The semiconductor device of claim 1, wherein the region containing the impurity contains at least one element selected from phosphorus (P), nitrogen (N), arsenic (As), antimony (Sb), bismuth (Bi), fluorine (F), chlorine (Cl), bromine (Br), iodine (I), astatine (At), hydrogen (H) and boron (B).

9. The semiconductor device of claim 1, wherein the graphene interconnect and the insulation film have a dummy via hole in which a dummy via conducting portion is provided.

10. The semiconductor device of claim 9, wherein the graphene interconnect has a region containing an impurity around the dummy via hole, and a concentration of the impurity decreases as a distance from the dummy via hole increases.

* * * * *